(12) United States Patent
Marks

(10) Patent No.: US 6,362,110 B1
(45) Date of Patent: Mar. 26, 2002

(54) ENHANCED RESIST STRIP IN A DIELECTRIC ETCHER USING DOWNSTREAM PLASMA

(75) Inventor: Jeffrey Marks, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 09/539,294

(22) Filed: Mar. 30, 2000

(51) Int. Cl.[7] .......................................... H01L 21/3065
(52) U.S. Cl. ...................................................... 438/711
(58) Field of Search ................................ 438/706, 707, 438/710, 711

(56) References Cited

U.S. PATENT DOCUMENTS

| | | | |
|---|---|---|---|
| 5,534,751 A | | 7/1996 | Lenz et al. ............. 315/111.71 |
| 5,849,639 A | * | 12/1998 | Molloy et al. ............... 438/714 |
| 5,904,799 A | * | 5/1999 | Donohoe ..................... 156/345 |
| 6,109,206 A | * | 8/2000 | Maydan et al. ......... 118/723 IR |
| 6,168,726 B1 | * | 1/2001 | Li et al. ........................ 216/79 |
| 6,170,428 B1 | * | 1/2001 | Redeker et al. ........... 118/723 I |
| 2001/0000246 A1 | * | 4/2001 | Tang et al. .................. 438/689 |
| 2001/0004552 A1 | * | 6/2001 | Tang et al. .................. 438/689 |

OTHER PUBLICATIONS

Article from website www.astex.com, entitled "Plasma Sources and Systems", 2 pages.

* cited by examiner

*Primary Examiner*—Benjamin L. Utech
*Assistant Examiner*—Matthew Anderson
(74) *Attorney, Agent, or Firm*—Beyer Weaver & Thomas, LLP

(57) ABSTRACT

A method and apparatus for performing a dielectric etch, etch mask stripping, and etch chamber clean. A wafer is placed in an etch chamber. A dielectric etch is performed on the wafer using an in situ plasma generated by an in situ plasma device in the etch chamber. The etch mask is stripped using a remote plasma generated in a remote plasma device connected to the etch chamber. The wafer is removed from the etch chamber and either the in situ plasma or the remote plasma may be used to clean the etch chamber. In etch chambers that do not use confinement rings, a heater may be used to heat the etch chamber wall to provide improved cleaning.

9 Claims, 4 Drawing Sheets

ENHANCED RESIST STRIP IN A DIELECTRIC ETCHER USING DOWNSTREAM PLASMA

BACKGROUND OF THE INVENTION

The present invention relates to the manufacture of semiconductor devices. More particularly, the present invention relates to improved techniques for dielectric etching and resist stripping.

In the manufacture of certain types of semiconductor devices, dielectric layers may be etched using a plasma etching system. Such plasma etching systems may be high density plasma systems, such as inductive or ECR systems, or medium density plasma systems, such as a capacitive system. The high density plasma etchers dissociate gases so well that by providing oxygen to the chamber the chamber walls are cleaned. This cleaning may be caused by the heat generated by the plasma, UV radiation generated by the plasma, and a lot of dissociation caused by the plasma.

Medium density plasma etching systems, such as capacitive plasma systems, may be used for oxide etching. In such medium density plasma etching systems a polymer forming chemistry is typically employed. Such medium density plasma etching systems typically cause polymer deposits to form on the chamber wall. Such systems usually allow the polymer deposits to build on the chamber walls and then are wet cleaned to remove the polymer deposits. The wet cleaning is typically required in medium density plasma systems, since such systems typically do not have sufficient dissociation, and sufficient plasma energy contacting the walls to perform a satisfactory polymer cleaning. When the chamber walls are only partially cleaned and polymer is not satisfactorily removed, sometimes new polymer does not sufficiently stick to the chamber wall possibly creating particles, which could be an added source of contamination.

Plasma etching systems that use plasma confinement, such as the device disclosed in U.S. Pat. No. 5,534,751 by Lenz et al., entitled "Plasma Etching Apparatus Utilizing Plasma Confinement", issued Jul. 9, 1996, generally confine a plasma within a confinement ring that keeps the plasma in a confined area away from the chamber wall. Keeping the plasma in a confined area generally provides a dense enough and hot enough plasma adjacent to the confinement ring to clean the confinement ring.

It is known to provide CVD devices with remote plasma sources, which are typically used to clean the CVD chamber. Typically such plasma devices use a fluorine chemistry. Such CVD devices are used for vapor deposition.

It is known to use a remote plasma source in a strip chamber, which typically uses the remotely generated plasma to strip an etch mask.

In view of the foregoing, it would be desirable in medium density plasma systems, where a plasma of a density that is insufficient to sufficiently clean the chamber wall is generated by the medium density plasma systems, to provide a means for providing a plasma to sufficiently clean the chamber walls.

SUMMARY OF THE INVENTION

The invention relates, in one embodiment, to a medium density dielectric plasma etching system with an additional remote plasma source to provide a cleaning of the plasma system and to possibly allow stripping within the etching system.

The invention relates, in a second embodiment, to a medium density plasma system with an additional remote plasma source and with a heater for heating the walls of the chamber to allow cleaning of the chamber wall.

The invention relates, in a third embodiment, to a confined medium density plasma system with an additional remote plasma source to increase the rate of in situ stripping.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
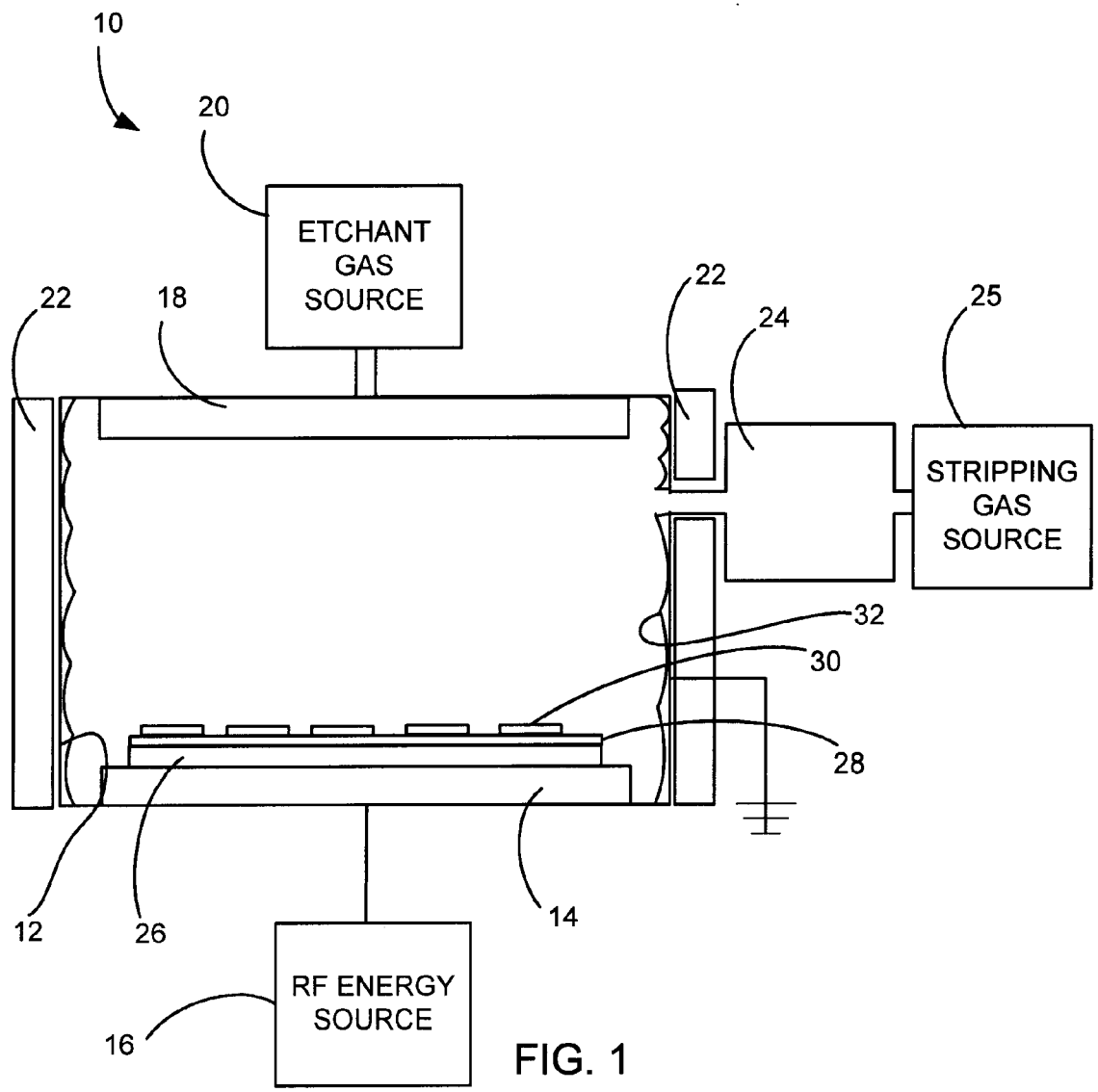
FIG. 1 is a schematic view of an etch chamber.

To facilitate discussion, FIG. 1 depicts a schematic view of an etch chamber 10 of a preferred embodiment of the invention. The etch chamber 10 comprises a chamber wall 12 which is grounded, an electrostatic chuck 14 connected to a radio frequency energy source 16, an etchant gas distribution system 18 at the top of the etch chamber 10 connected to an etchant gas source 20, heaters 22 adjacent to and surrounding the chamber wall 12, and a remote plasma source 24 connected to a stripping gas source 25. The chamber wall 12 may be of anodized aluminum or a conductive ceramic.

Figure 2:
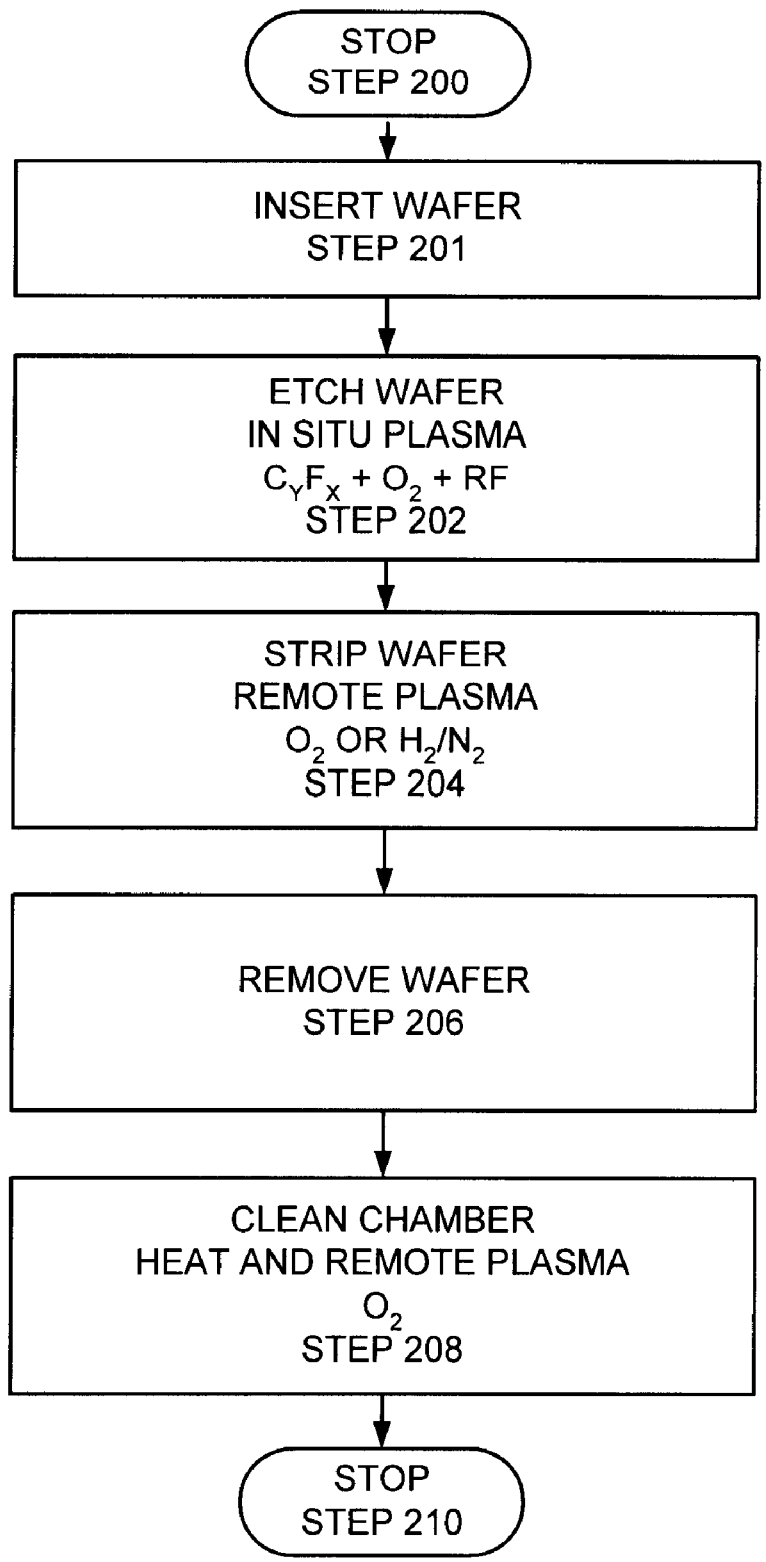
FIG. 2 is a flow chart of the process for using the etch chamber shown in FIG. 1.

FIG. 2 is a flow chart of the operation of the etch chamber used in a preferred embodiment of the invention. A wafer 26 is mounted on the electrostatic chuck 14 within and near the bottom of the etch chamber 10 (step 201). The wafer 26 has a dielectric layer 28, such as an oxide layer of silicon oxide or a nitride layer, where part of the dielectric layer 28 is covered by a resist mask 30 and part of the dielectric layer 28 is not covered by the resist mask 30.

Next the etch chamber 10 etches away the part of the dielectric layer 28 that is not covered by the resist mask 30 (step 202). This is accomplished by flowing an etchant gas into the etch chamber 10, so that the pressure in the etch chamber is between 20 and 200 milliTorr. In the preferred embodiment of the invention the etchant gas comprises a fluorocarbon gas with a generic molecular formula of $C_yF_x$ and oxygen. The amount of the etchant gas used is known in the prior art. The etchant gas is provided by the etchant gas source 20 through the etchant gas distribution system 18 at the top of the etch chamber 10. The radio frequency energy source 16 provides a radio frequency signal to the electrostatic chuck 14, which creates radio frequency waves between the electrostatic chuck 14 and the grounded chamber wall 12, which energizes the etchant gas with the electrostatic chuck 14 acting as a cathode and the chamber wall 12 acting as an anode. The energized etchant gas dissociates into ions, which are energized by the radio frequency wave, creating a plasma within the chamber and surrounding the wafer 26. Since the wafer is within the plasma, the parts of the dielectric layer 28 that are not covered by the resist mask 30 are etched away. Since the chamber wall 12, electrostatic chuck 14, energy source 16, etchant gas distribution system 18, and etchant gas source 20 form and sustain the plasma around the wafer, these components provide an in situ plasma. As a result of the etching process, a polymer residue 32, formed from the resist mask 30 and fluorocarbon etchant gas, forms on the chamber wall 12. When the dielectric layer 28 is sufficiently etched the etching step (step 202) is stopped by stopping the generation of the in situ plasma.

The remote plasma source 24 is shown connected to the chamber wall 12. The remote plasma source 24 may be placed at another location around the etch chamber 10. The entry between the remote plasma source 24 and the interior of the chamber 10 must be sufficiently large so that a sufficient number of oxygen radicals created in the remote plasma source 24 are able to pass from the remote plasma source 24 to the interior of the chamber 10 without being lost. The remote plasma source 24 may use either a microwave or an inductive discharge or some other high density dissociative remote source. An example of such a remote source is an ASTRON by ASTeX of Woburn, Mass. Oxygen is provided to the remote plasma source 24 from the stripping gas source 25. The remote plasma source 24 dissociates the oxygen creating oxygen radicals, which are flowed into the etch chamber 10, so that the pressure in the chamber is between 100 and 1,000 milliTorr. The oxygen radicals react with the resist mask 30 to strip away the resist mask 30 (step 204). In the preferred embodiment, the flow of the etch gas from the etch gas source 20 and power from the radio frequency energy source 16 is discontinued, so that the stripping of the resist mask 30 is accomplished solely by the oxygen radicals. In another embodiment, the in situ plasma may be used in combination with the remote plasma to provide stripping. In another embodiment, for the stripping gas, a hydrogen and nitrogen mixture may be used separately or in combination with oxygen.

To discontinue the stripping step, the flow of the reactants from the remote plasma source 24 is stopped. The wafer 26 is removed from the etch chamber 10 (step 206). To clean the polymer residue 32 from the chamber wall 12 the chamber wall heater 22 heats the chamber wall 12. In a preferred embodiment, the chamber wall is heated to a temperature of 80° to 300° C. In a more preferred embodiment of the invention, the chamber wall is heated to a temperature of 120° C to 200° C. In a most preferred embodiment of the invention, the chamber wall is heated to a temperature of 150° C. Oxygen is provided to the remote plasma source 24 from the stripping gas source 25. The remote plasma source 24 dissociates the oxygen creating oxygen radicals, which are flowed into the etch chamber 10, so that the pressure in the chamber is between 100 and 1,000 milliTorr. The oxygen radicals react with the heated chamber wall 12 to clean the polymer residue 32 from the chamber wall 12 (step 208). In another embodiment a hydrogen and nitrogen mixture may be used separately or in combination with oxygen as a plasma source from the remote plasma source. When the chamber wall 12 is sufficiently clean, the plasma from the remote plasma source 24 is stopped and the etch chamber 10 is ready for the next wafer.

Figure 3:
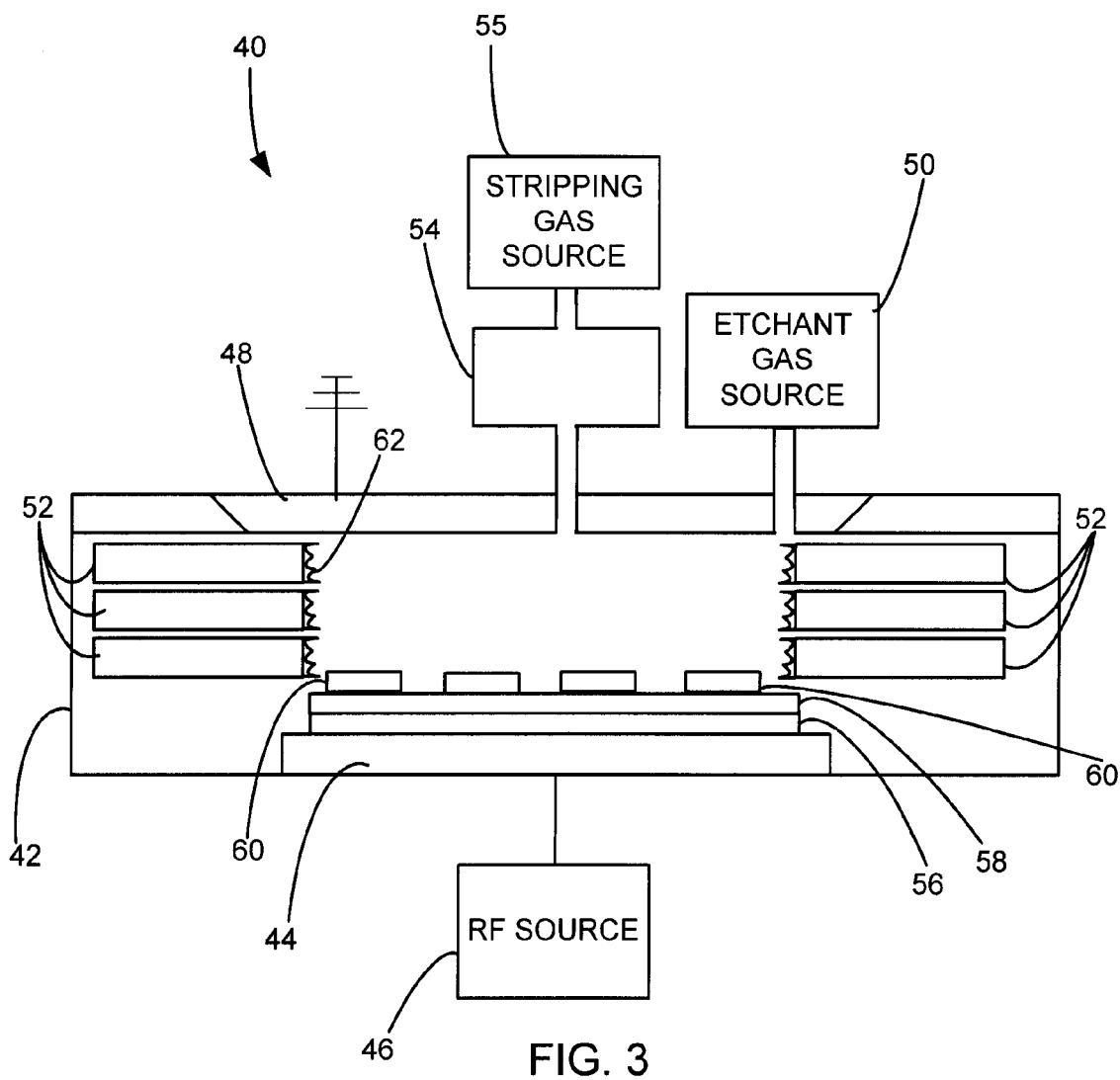
FIG. 3 is a schematic view of another etch chamber.

FIG. 3 is a schematic view of an etch chamber 40 of another preferred embodiment of the invention that uses a confined plasma. The etch chamber 40 comprises a chamber wall 42, an electrostatic chuck 44 connected to a radio frequency (RF) energy source 46, an anode 48 that is grounded, an etchant gas source 50, confinement rings 52 and a remote plasma source 54 connected to a stripping gas source 55. The electrostatic chuck 44 which acts as a cathode at the bottom of the etch chamber 40 and the anode 48 at the top of the etch chamber 40 are placed close together to confine the plasma region to a small area. The confinement rings 52 surround the sides of the plasma region to further confine the plasma region, keeping the plasma near the center of the etch chamber 40 and away from the chamber wall 42. The confinement rings 52 may be made of quartz and are formed as ring shaped plates that are spaced apart with narrow gaps between the confinement rings 52. In this example, three confinement rings 52 are shown, but one or more confinement rings may be used in other embodiments. The narrow gaps between the confinement rings 52 keep the plasma from reaching the chamber wall 42, since the gaps are so small that most plasma passing within the gap will be extinguished by a collision with a confinement ring 52 before the plasma reaches the chamber wall 42.

Figure 4:
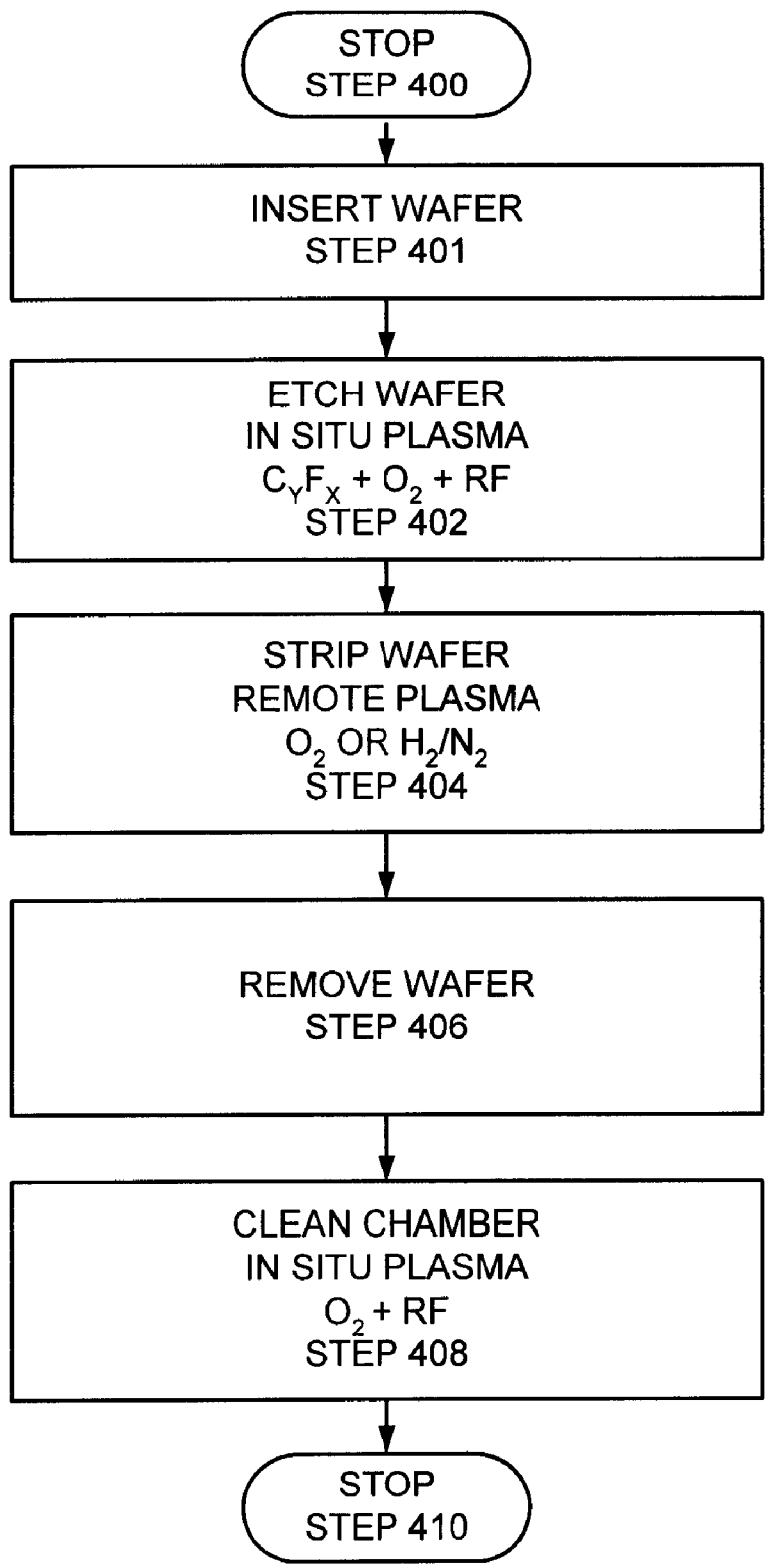
FIG. 4 is a flow chart of the process for using the etch chamber shown in FIG. 3.

FIG. 4 is a flow chart of the operation of the etch chamber used in a preferred embodiment of the invention. A wafer 56 is mounted on the electrostatic chuck 44 within and near the bottom of the etch chamber 40 (step 401). The wafer 56 has a dielectric layer 58, such as an oxide layer of silicon oxide or a nitride layer, where part of the dielectric layer 58 is covered by a resist mask 60 and part of the dielectric layer 58 is not covered by the resist mask 60.

Next the etch chamber 40 etches away the part of the dielectric layer 58 that is not covered by the resist mask 60 (step 402). This is accomplished by flowing an etchant gas into the etch chamber 40, so that the pressure in the etch chamber is between 20 and 200 milliTorr. In the preferred embodiment of the invention, the etchant gas comprises a fluorocarbon gas with a generic molecular formula of $C_YF_X$ and oxygen. The amount of the etchant gas used is known in the prior art. The etchant gas is provided by the etchant gas source 50 connected to the etch chamber 40. The radio frequency energy source 46 provides a radio frequency signal to the electrostatic chuck 44, which creates radio frequency waves between the electrostatic chuck 44 and the grounded anode 48, which energizes the etchant gas. The energized etchant gas dissociates into ions, which are energized by the radio frequency wave, creating a plasma within the chamber and surrounding the wafer 56. Since the wafer is within the plasma, the parts of the dielectric layer 58 that are not covered by the resist mask 60 are etched away. Since the electrostatic chuck 44, energy source 46, anode 48, and etchant gas source 50 form and sustain the plasma around the wafer, these components provide an in situ plasma. As a result of the etching process, a polymer residue 62, formed from the resist mask 60 and fluorocarbon etchant gas, forms on the confinement rings 52. When the dielectric layer 58 is sufficiently etched, the etching step (step 402) is stopped by stopping the generation of the in situ plasma.

The remote plasma source 54 is shown connected to the etch chamber wall 40 through the anode 48. The entry between the remote plasma source 54 and the interior of the chamber 40 must be sufficiently large so that a sufficient number of oxygen radicals created in the remote plasma source 54 are able to pass from the remote plasma source 54 to the interior of the chamber 40 without being lost. The remote plasma source 54 may use either a microwave or an inductive discharge or some other high density dissociative remote source. An example of such a remote source is an ASTRON by ASTeX of Woburn, Mass. Oxygen is provided to the remote plasma source 54 from the stripping gas source 55. The remote plasma source 54 dissociates the oxygen creating oxygen radicals, which are flowed into the etch chamber 40, so that the pressure in the chamber is between 100 and 1,000 milliTorr. The oxygen radicals react with the resist mask 60 to strip away the resist mask 60 (step 404). In the preferred embodiment, the flow of the etch gas from the etch gas source 50 and power from the radio frequency energy source 46 is continued, so that the stripping of the resist mask 60 is accomplished by the oxygen radicals from the remote plasma source 54 and in situ plasma. In another embodiment, a hydrogen and nitrogen mixture may be used separately or in combination with oxygen as a plasma source from the remote plasma source. To discontinue the stripping step, the flow of the reactants from the remote plasma source 54 and the in situ plasma are stopped.

The wafer 56 is removed from the etch chamber 40 (step 406). To clean the polymer residue 62 from the confinement rings 52, an oxygen or nitrogen/hydrogen etchant gas is flowed into the etch chamber 40 so that the pressure in the chamber is between 100 and 1,000 milliTorr. The amount of the etchant gas used is known in the prior art. The radio frequency energy source 46 provides a radio frequency signal to the electrostatic chuck 44, which creates radio frequency waves between the electrostatic chuck 44 and the grounded anode 48, which energizes the etchant gas. The energized etchant gas dissociates into ions, which are energized by the radio frequency wave, creating a plasma within the chamber and surrounding the wafer 56. Since the in situ plasma is confined to a small region by the electrostatic chuck 44, the anode 48, and the confinement rings 52, the in situ plasma is dense and energetic enough to clean the polymer residue 62 from the confinement rings 52. When the confinement rings 52 are sufficiently clean, the in situ plasma is stopped and the etch chamber 40 is ready for the next wafer.

In another embodiment, the in situ plasma and the remote plasma are both used for cleaning either in an etch chamber without a confined plasma or an etch chamber with a confined plasma.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching at least partially through a dielectric layer disposed above a substrate, wherein part of said dielectric layer is disposed below an etch mask and part of said dielectric layer is not disposed below the etch mask, comprising the steps of:

placing the substrate in an etch chamber;

flowing an etchant gas into the etch chamber;

creating an in situ plasma from the etchant gas in the etch chamber;

etching away parts of dielectric layer not disposed below the etch mask;

generating a remote plasma in a remote plasma source;

flowing the remote plasma into the etch chamber;

stripping away the etch mask, while the substrate is in the etch chamber; and removing the substrate from the etch chamber.

2. The method, as recited in claim 1, further comprising the step of providing a plasma to clean the etch chamber after the step of removing the substrate from the etch chamber.

3. The method, as recited in claim 2, wherein the step of providing a plasma clean to the etch chamber, comprises the steps of:

heating an etch chamber wall to a temperature above 80°;

generating a remote plasma in the remote plasma source;

flowing the remote plasma into the etch chamber; and using the remote plasma to remove residue from the heated chamber wall.

4. The method, as recited in claim 2, wherein the etchant gas further comprises oxygen.

5. The method, as recited in claim 4, further comprising the step of discontinuing the flow of etchant gas into the etch chamber before the step of flowing the remote plasma into the etch chamber.

6. The method, as recited in claim 5, wherein the remote plasma generated in the remote plasma source is from a gas from the group consisting of oxygen, nitrogen, and hydrogen.

7. The method, as recited in claim 5, wherein the step of providing a plasma clean to the etch chamber, comprises the step of heating an etch chamber wall to a temperature above 80°.

8. The method, as recited in claim 7, wherein the step of providing a plasma clean to the etch chamber, further comprises the steps of:

generating a remote plasma in the remote plasma source;

flowing the remote plasma into the etch chamber; and using the remote plasma to remove residue from the heated chamber wall.

9. The method, as recited in claim 5, further comprising the step of, confining the plasma within confinement rings, and wherein the step of providing a plasma clean to the etch chamber, comprises the steps of:

flowing the etchant gas into the etch chamber;

creating an in situ plasma from the etchant gas in the etch chamber; and using the in situ plasma from the etchant gas to remove residue from the confinement rings.

* * * * *